(12) United States Patent
Powell (10) Patent No.: US 6,300,593 B1
(45) Date of Patent: Oct. 9, 2001

(54) APPARATUS AND METHOD FOR LASER SCRIBING A COATED SUBSTRATE

(75) Inventor: Ricky C. Powell, Ypsilanti, MI (US)

(73) Assignee: First Solar, LLC, Toledo, OH (US)

( * ) Notice: Subject to any disclaimer, the term of this patent is extended or adjusted under 35 U.S.C. 154(b) by 0 days.

(21) Appl. No.: 09/457,062

(22) Filed: Dec. 7, 1999

(51) Int. Cl.[7] ................................................. B23K 26/00
(52) U.S. Cl. ............................ 219/121.68; 219/121.69; 219/121.67; 219/121.74
(58) Field of Search ....................... 219/121.68, 121.67, 219/121.69, 121.73, 121.74, 121.76

(56) References Cited

U.S. PATENT DOCUMENTS

| | | | |
|---|---|---|---|
| 4,180,822 | * | 12/1979 | Hudson et al. ...................... 346/108 |
| 4,500,771 | * | 2/1985 | Miller ........................... 219/121 LH |
| 4,568,409 | * | 2/1986 | Caplan ................................. 156/643 |
| 4,877,939 | * | 10/1989 | Duley et al. .................... 219/121.76 |
| 5,430,816 | * | 7/1995 | Furuya et al. ......................... 385/33 |

\* cited by examiner

Primary Examiner—M. Alexander Elve
(74) Attorney, Agent, or Firm—Brooks & Kushman P.C.

(57) ABSTRACT

Apparatus (20) and a method for laser scribing a coated substrate (22) utilizes a rotating polygonal mirror (36) to split a pulsed laser beam (30) in order to provide spaced ablations (34) in a coating (26) on the substrate. The laser pulses are directed through at least one lens (56, 60) and may be passed through fiber optics (62). A laser detector (68) may be used to detect the rotational position of the rotating polygonal mirror (36). A controller (76", 76'") allows a second set of scribes to be generated with reference to the first set of scribes.

26 Claims, 4 Drawing Sheets

APPARATUS AND METHOD FOR LASER SCRIBING A COATED SUBSTRATE

TECHNICAL FIELD

This invention relates to apparatus and a method for laser scribing a coated substrate and has particular utility for laser scribing semiconductor and metallic contact layers on a glass sheet substrate in connection with manufacturing photovoltaic panels.

BACKGROUND ART

Pulsed laser beams have previously been utilized to scribe through a coating on a substrate such as is done in manufacturing photovoltaic panels. Two approaches have been used to accommodate the relatively fast pulse rates of current YAG lasers in comparison to the speed at which the substrates can be moved. One approach called flying optics requires precise mechanical motion of optic elements along a rail as well as requiring precise mechanical motion of the substrate being scribed, and this approach consequently requires acceleration and deceleration of relatively massive components. Another approach uses galvonometer deflectors but equipment of this type is not yet commercially available for scribing coated substrates the size of photovoltaic panels.

DISCLOSURE OF INVENTION

One object of the present invention is to provide improved apparatus for laser scribing a coated workpiece by splitting the laser beam to provide multiple scribes during movement of the substrate.

In carrying out the above object, the apparatus for laser scribing a coated substrate includes a laser source for generating a pulsed laser beam having laser pulses with sufficient power to form ablations through a coating on the substrate. A polygonal mirror of the appatus is mounted for rotation to reflect the laser pulses of the laser beam toward the substrate to split the laser beam and provide spaced ablations through the coating. A conveyor of the apparatus moves the substrate along a direction of conveyance so the ablations formed by the laser pulses reflected from the rotating polygonal mirror overlap each other and form a set of spaced scribes through the coating on the substrate and extending parallel to the direction of conveyance.

The apparatus includes at least one lens through which the laser pulses are passed and directed toward the substrate to provide the ablations through the coating on the substrate. In one embodiment, the apparatus includes a plurality of focusing lenses through which the laser pulses are passed and directed toward the substrate to provide the ablations through the coating on the substrate. In another embodiment, the apparatus includes a field flattening lens through which the laser pulses are passed and directed toward the substrate to provide the ablations through the coating on the substrate.

Another embodiment of the apparatus includes a plurality of fiber optics through which the laser pulses are passed for passage toward the substrate to provide the ablations through the coating on the substrate. This fiber optic embodiment also includes at least one lens through which the laser pulses are passed from the fiber optics and directed toward the substrate to provide the ablations through the coating on the substrate.

The apparatus can also include a laser detector for detecting the rotational location of the rotating polygonal mirror.

Other embodiments of the apparatus also each include a controller for generating a second set of laser pulses that are referenced to the first set of laser scribes to generate a second set of scribes through the coating on the substrate in a spaced relationship from each other and from the first set of scribes. In one such embodiment, the controller includes a trigger beam actuator for generating trigger pulses referenced to the first set of scribes to generate the second set of laser pulses that are directed toward the substrate to scribe the second set of scribes that are spaced on the substrate from each other and from the first set of spaced scribes. In another such embodiment, the controller includes a detector that compares the locations of the ablations provided by the second set of laser pulses with respect to the first set of scribes and provides adjustment as necessary to provide the desired spacing between the sets of scribes.

Another object of the present invention is to provide an improved method for laser scribing a coated substrate by splitting a pulsed laser beam to provide a set of spaced scribes.

In carrying out the immediately preceding object, the method for laser scribing a coated substrate is performed by generating a pulsed laser beam having laser pulses with sufficient power to ablate through a coating on the substrate. A polygonal mirror is rotated to reflect the laser pulses of the laser beam toward the substrate to split the laser beam and form spaced ablations through the coating. The substrate is moved along a direction of conveyance so the ablations formed by the laser pulses overlap each other and form a set of spaced scribes through the coating on the substrate and extending parallel to the direction of conveyance.

In performing the laser scribing method, the laser pulses are preferably reflected from the rotating polygonal mirror and passed through at least one lens to provide the ablations through the coating on the substrate. In one practice, the laser pulses are reflected from the rotating polygonal mirror and focused through a plurality of focusing lenses to provide the ablations through the coating on the substrate. In another practice, the laser pulses are reflected from the rotating polygonal mirror and passed through a field flattening lens to provide the ablations through the coating on the substrate.

In another practice of the method, the laser pulses are passed through a plurality of fiber optics toward the substrate to provide the ablations through the coating on the substrate. In this practice, the laser pulses are passed from the fiber optics to and through at least one lens toward the substrate to provide the ablations through the coating on the substrate.

It is also possible for the method to utilize a laser detector to detect the rotational position of the polygonal mirror.

In another practice of the laser scribing method of this invention, a second set of laser pulses is generated with reference to the first set of scribes to provide a second set of scribes in a spaced relationship from each other and from the first set of scribes in the coating on the substrate. In one practice, this is performed by trigger pulses that are generated with reference to the first set of scribes to actuate generation of the second set of laser pulses that provide the second set of laser scribes spaced on the substrate from each other and from the first set of spaced scribes. In another practice, the second set of laser pulses is generated to provide overlapping ablations that provide the second set of scribes in the coating on the substrate and the locations of the overlapping ablations provided by the second set of laser pulses are detected and compared to the first set of scribes and any necessary adjustment is performed to in order to provide a desired spacing of the second set of scribes from each other and from the first set of scribes in the coating on the substrate.

The laser scribing method of the invention has particular utility for forming scribes through a semiconductor coating on a substrate and particularly when the substrate is a glass sheet.

In addition, the laser scribing method has particular utility for forming scribes through a metallic coating on a substrate and particularly when the substrate is a glass sheet.

The objects, features and advantages of the present invention are readily apparent from the following detailed description of the best mode for carrying out the invention when taken in connection with the accompanying drawings.

BEST MODE FOR CARRYING OUT THE INVENTION

Figure 1:
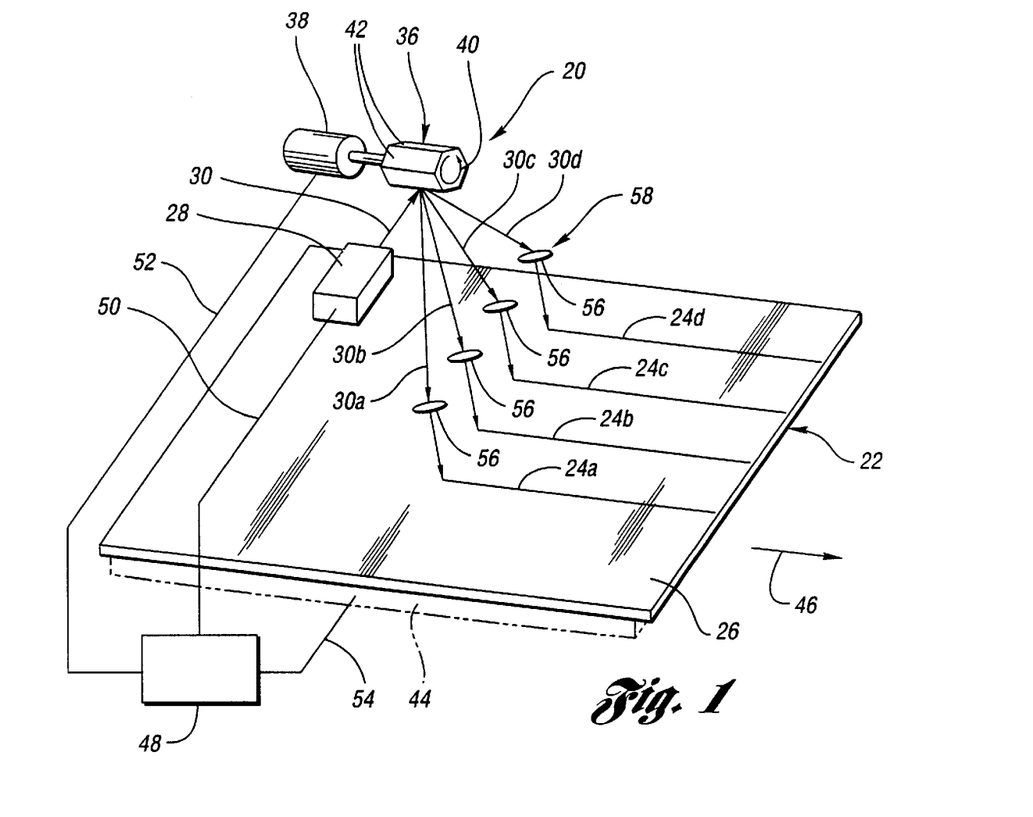
FIG. 1 is a schematically indicated perspective view of apparatus constructed in accordance with the invention to provide laser scribing of a coated substrate by dividing a pulsed laser beam.

With reference to FIG. 1 of the drawings, laser scribing apparatus generally indicated by 20 is constructed in accordance with the invention to perform the method thereof of laser scribing a coated substrate generally indicated by 22. More specifically, the laser scribing apparatus 20 as illustrated provides a plurality of spaced scribes $24_a$, $24_b$, $24_c$ and $24_d$ through a coating 26 on the substrate. Both the apparatus 20 and its method of operation will be described in an integrated manner to facilitate an understanding of all aspects of the invention. This laser scribing is advantageously performed through semiconductor and metallic layers on a glass sheet substrate in connection with photovoltaic manufacturing as is hereinafter more fully described and may be performed to simultaneously scribe through coatings with one or more layers.

Figure 2:
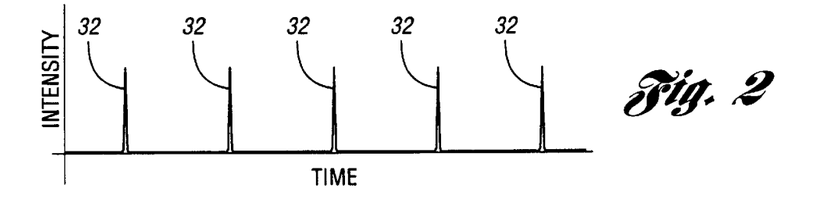
FIG. 2 is a schematic representation showing the laser pulses.
Figure 3:
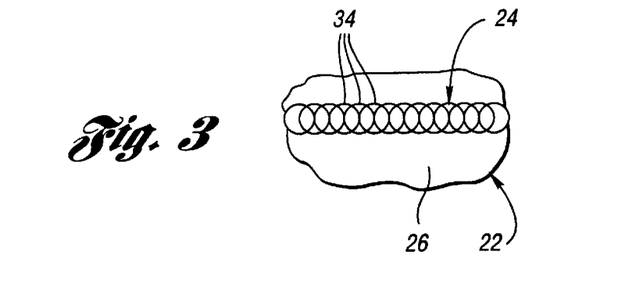
FIG. 3 is a view that illustrates the manner in which the laser pulses form overlapping ablations through a coating on the substrate to provide a scribe.

As illustrated in FIG. 1, the apparatus 20 includes a laser source 28 for generating a pulsed laser beam 30 that, as shown in FIG. 2, has laser pulses 32 with sufficient power to form overlapping ablations 34 through the coating 26 on the substrate 22 as shown in FIG. 3. A polygonal mirror 36 shown in FIG. 1 is rotatively driven by a motor 38 in the direction shown by arrow 40 and has facets 42 toward which the pulsed laser beam 30 is directed for reflection of the laser pulses, which effectively splits the laser beam into branch beams $30_a$, $30_b$, $30_c$ and $30_d$ that provide the ablations for forming the scribes $24_a$, $24_b$, $24_c$, and $24_d$. A schematically indicated conveyor 44 which may be of any suitable type moves the substrate 22 in the direction shown by arrow 46 so that ablations formed by the laser pulses reflected from the rotating polygonal mirror overlap each other and form the set of spaced scribes $24_a$, $24_b$, $24_c$, and $24_d$ through the coating 26 on the substrate 22. A suitable control 48 has a connection 50 to the laser beam source 28, a connection 52 to the motor 38 that rotatively drives the polygonal mirror 36 and a connection 54 to the conveyor 44 so as to coordinate operation of all of the components to provide the scribing as intended.

Figure 4:
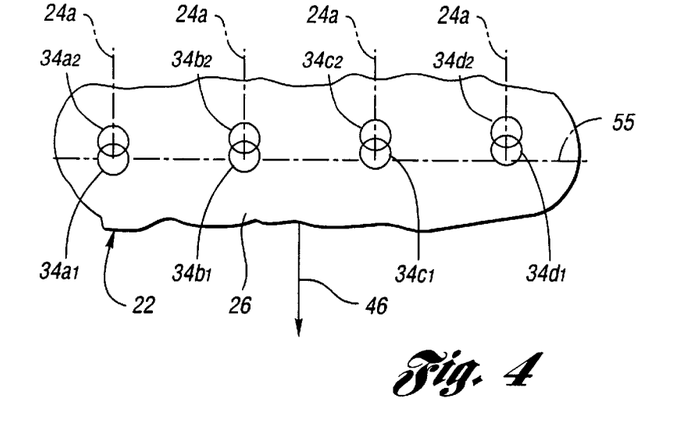
FIG. 4 is a schematic view that illustrates the manner in which the overlapping ablations form spaced scribes in the coating on the substrate by splitting of the pulsed laser beam.

The manner in which the scribing is performed is schematically illustrated in FIG. 4 which shows the coated substrate 22 moving in the direction of arrow 46 for the scribing of the coating 26 as scribes $24_a$, $24_b$, $24_c$, and $24_d$ that extended parallel to the direction of conveyance shown by arrow 46. As the first laser pulse is reflected from one facet 42 of the rotating polygonal mirror 36 shown in FIG. 1, it forms the first ablation $34_{a1}$ shown in FIG. 4 through the substrate coating 26. Subsequent pulses from that first mirror facet sequentially form the ablations $34_{b1}$, $34_{c1}$ and $34_{d1}$. As illustrated by reference line 55, each succeeding ablation is slightly downstream on the substrate from the previous one due to the movement of the substrate 22 by the conveyance indicated by arrow 46. As the laser beam then reflects off the next facet of the polygonal mirror, the ablations $34_{a2}$, $34_{b2}$, $34_{c2}$ and $34_{d2}$ are formed successively overlapping the earlier formed ablations of the associated scribes, and the process continues until the substrate is entirely scribed. Good results have been achieved with the ablations overlapping each other by 50%; specifically, the distance between the center of ablations in each scribe is 50% of the diameter of the ablation.

For ablation overlapping of about 50% utilized with conveyance speeds of 10–60 mm per second, conventional pulsed laser beams with frequencies of 10–100 kilohertz can theoretically provide up to about 100 scribes which is more than sufficient for the number of scribes needed to make photovoltaic panels.

With reference back to FIG. 1, the apparatus 20 includes at least one lens 56 and actually includes a plurality of focusing lenses arranged in a set or array 58 between the rotating polygonal mirror 36 and the coated substrate 22 being conveyed. The pulsed laser branch beams $30_{a1}$, $30_{b1}$, $30_{c1}$ and $30_{d1}$ pass through the lenses 56 and are directed toward the locations of the scribes $24_a$, $24_b$, $24_c$, and $24_d$ to perform the scribing as previously described.

Figure 5:
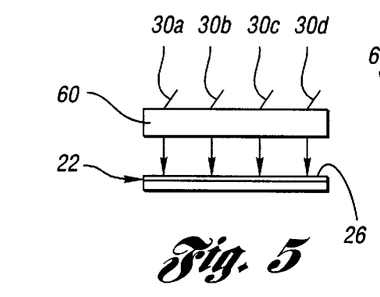
FIG. 5 illustrates a field flattening lens that is utilized to direct the laser pulses toward the coated substrate as an option to the array of focusing lenses illustrated in FIG. 1.
Figure 6:
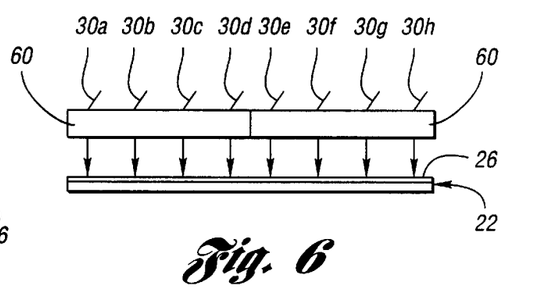
FIG. 6 illustrates the manner in which a pair of the field flattening lenses can be utilized to provide a larger lens for directing the laser pulses toward the coated substrate.

As illustrated in FIG. 5, the apparatus can also include a field flattening lens 60 that properly directs the laser beam branches $30_a$, $30_b$, $30_c$ and $30_d$ from an angular orientation to a perpendicular and properly focused relationship with respect to the coated substrate 22 to provide the scribing of its coating 26 as previously described. Depending upon the size of the substrate and the commercially available field flattening lenses, it may be economically advantageous to place two such field flattening lenses 60 side by side as illustrated in FIG. 6 for passage of the laser branch beams and direction and focusing to provide the scribing of the coating 26 on the substrate 22 by the laser branch beams $30_a$ through $30_h$ shown.

Figure 7:
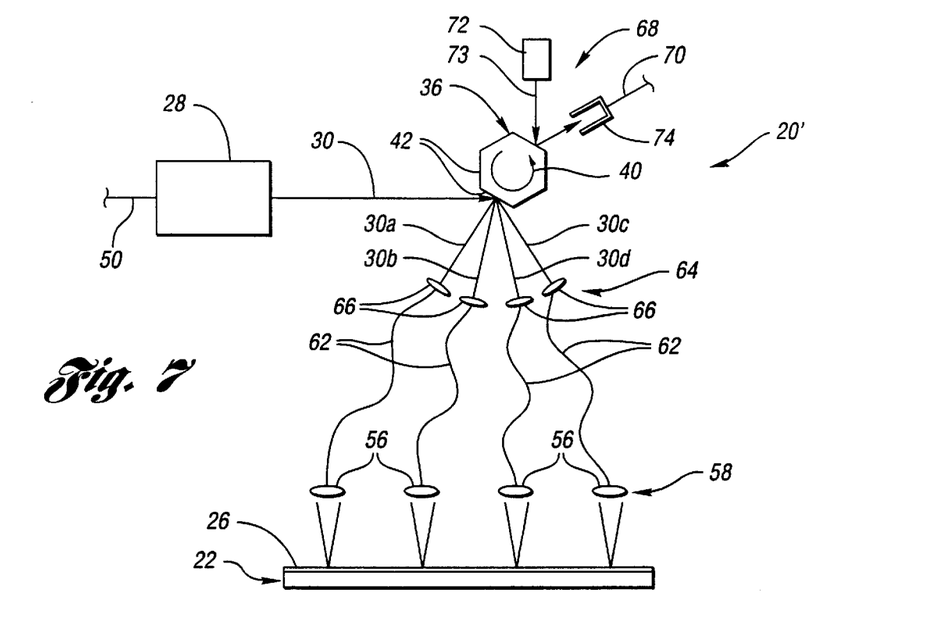
FIG. 7 is a schematic view that illustrates the use of fiber optics for directing the laser pulses from the rotating polygonal mirror to the substrate as well as also illustrating a laser detector for detecting the rotational position of a rotating polygonal mirror of the apparatus.

As illustrated in FIG. 7, the embodiment of the apparatus 20' includes fiber optics 62 through which the laser pulses are carried from the rotating polygonal mirror 36 to the substrate 22 for scribing of the coating 26. The laser pulses are directed into the fiber optics 62 through a lens array 64 including a set of focusing lenses 66. Furthermore, the laser pulses exit the fiber optics for passage to and through at least one lens such as the focusing lenses 56 of the array 58 illustrated. However, it is also possible for the pulses to exit the fiber optics 62 for passage through one or more field flattening lenses as described above in connection with FIGS. 5 and 6.

With continuing reference to FIG. 7, a laser detector generally indicated by 68 provides detection of the rotational position of the rotating polygonal mirror 36 and has a connection 70 to the apparatus control in order to integrate this information into the operation of the laser scribing. More specifically, the laser detector 68 includes a continuous wave laser source 72 that directs a continuous wave laser beam 73 toward the rotating polygonal mirror 36 for reflection therefrom to a position sensor 74 of the detector. The detected position of the rotating mirror 36 is then transferred through the connection 70 to the apparatus control for integration with the other operating parameters to provide the laser scribing.

Figure 8:
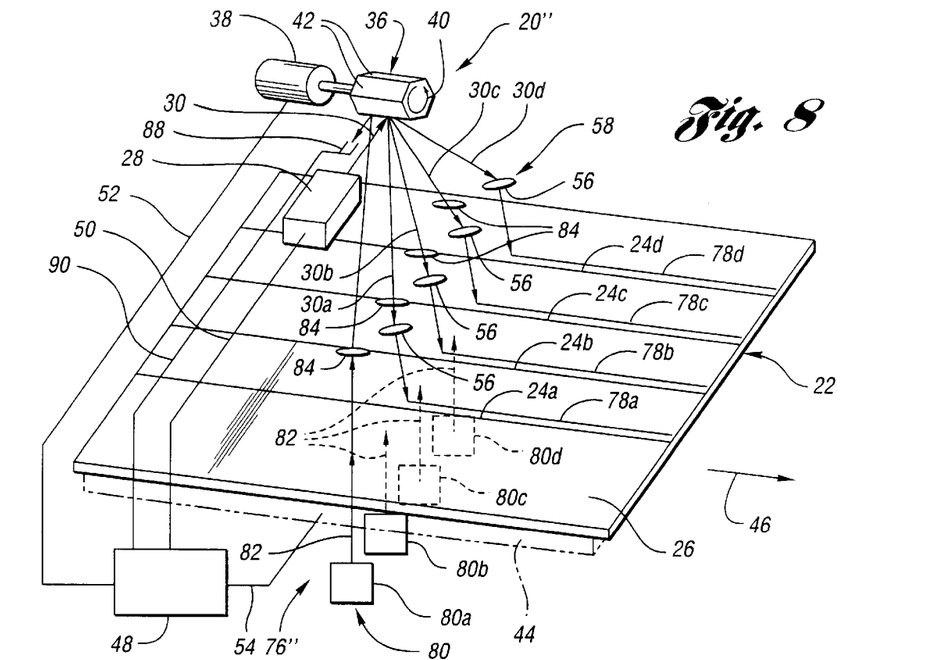
FIG. 8 is a schematic perspective view illustrating another embodiment for providing a second set of laser scribes that are referenced to the first set of scribes by a trigger laser.
Figure 9:
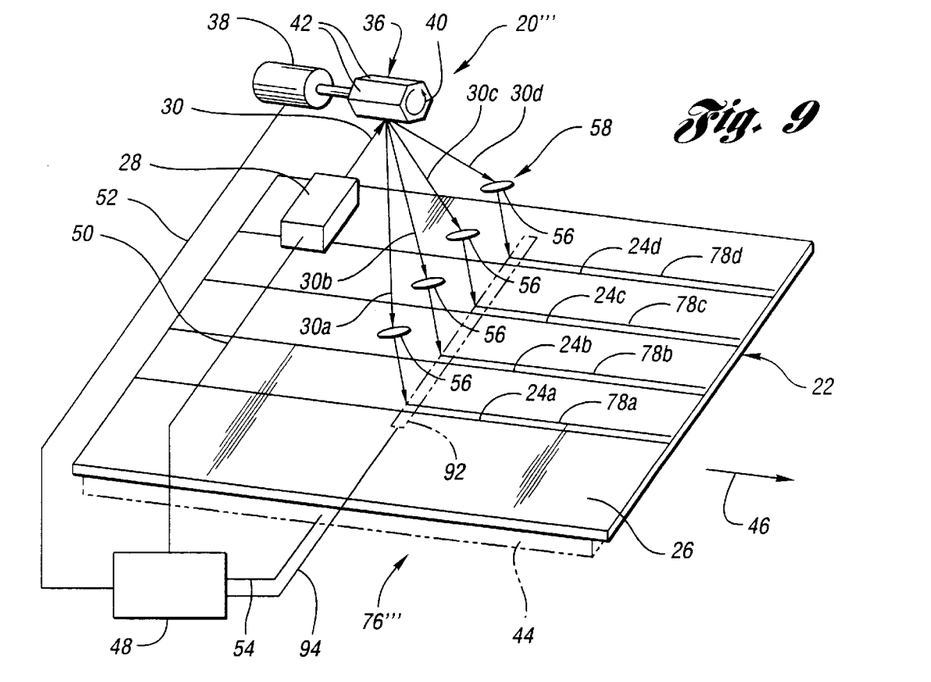
FIG. 9 is a schematic perspective view illustrating another embodiment for providing a second set of scribes referenced to the first set of scribes by comparing the locations of a second set of ablations with respect to the first set of scribes and then performing any necessary adjustment so as to have the desired spacing.

With reference to FIGS. 8 and 9, two additional embodiments of the apparatus are illustrated and indicated by 20'' and 20'''. Each of these embodiments includes a controller respectively indicated by 76'' and 76''' for generating a second set of laser pulses that are referenced to the first set of scribes $24_a$, $24_b$, $24_c$ and $24_d$ to generate a second set of scribes $78_a$, $78_b$, $78_c$, and $78_d$ through the coating 26 on the substrate in a spaced relationship from each other and from the first set of scribes.

As illustrated in FIG. 8, the controller 76'' of this embodiment includes a trigger beam actuator 80 including laser generators $80_a$, $80_b$, $80_c$ and $80_d$ that each generate a constant wave laser beam 82 that passes through an associated one of the first set of scribes $24_a$, $24_b$, $24_c$, and $24_d$ and is directed through an associated lens 84 toward the rotating polygonal mirror 36 for reflection from one of its facets 42 to a position sensor 88 that has a connection 90 to the control 48 in order to identify the location of the first set of scribes and coordinate the generation of the second set laser pulses that are directed toward the substrate 22 to scribe the second set of scribes $78_a$, $78_b$, $78_c$, and $78_d$ spaced on the substrate from each other and from the first set of spaced scribes $24_a$, $24_b$, $24_c$, and $24_d$. It is also possible to use a single constant wave laser source that is reflected from the rotating polygonal mirror 36 through the first set of laser scribes $24_a$, $24_b$, $24_c$, and $24_d$ to associated detectors below the substrate to provide triggering of the laser pulses that form the second set of scribes.

With reference to FIG. 9, the controller 76'' includes a detector 92 that compares the location of the ablations provided by the second set of laser pulses with respect to the first set of scribes $24_a$, $24_b$, $24_c$ and $24_d$ and through a connection 94 to the control 48 integrates this information with the other parameters to provide any necessary adjustment in order to provide the desired spacing of the second set of scribes with respect to each other and with respect to the first set of scribes in the coating on the substrate.

Figure 10:
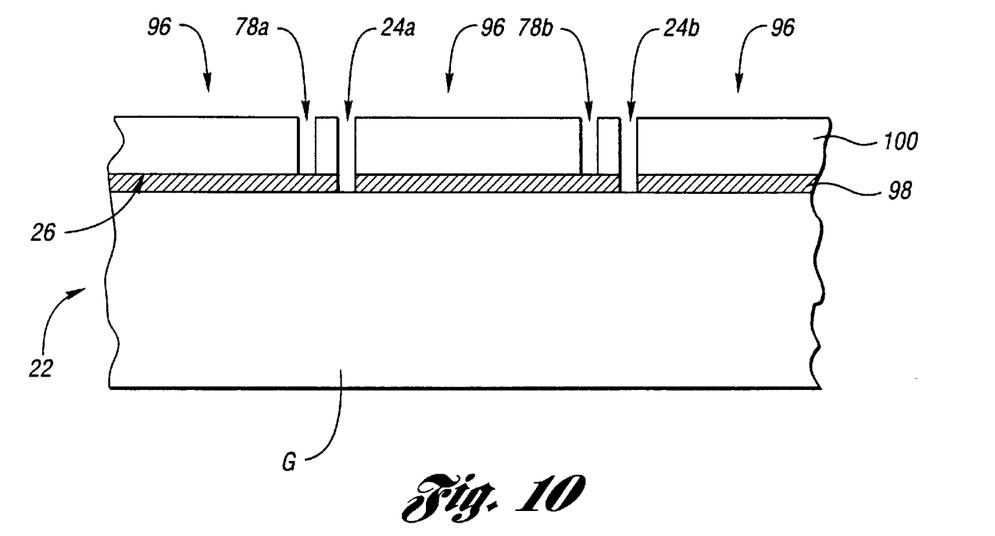
FIG. 10 is a cross sectional view through a glass sheet substrate that illustrates the manner in which the scribing can be performed through both a metallic contact layer and a semiconductor layer.
Figure 11:
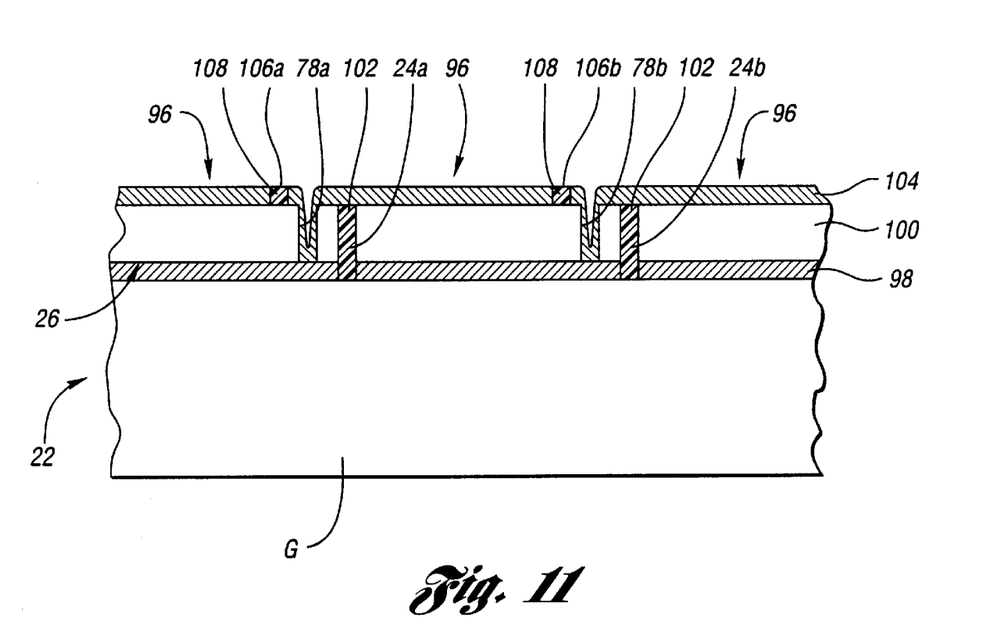
FIG. 11 is a view similar to FIG. 10 after the scribed substrate thereof has a dielectric material and further metallic contact layer applied thereto and further scribed and processed so as to provide solar cells.

With reference to FIGS. 10 and 11, the cross sectional views illustrated show how the laser scribing described above can advantageously be utilized to provide manufacturing of a photovoltaic panel with interconnected cells 96 as fully shown in FIG. 11. More specifically, the substrate 22 illustrated is a glass sheet G on which there is a metallic contact layer 98 of a transparent conductive oxide such as tin oxide. The substrate 22 also has a semiconductive layer 100 over the metallic contact layer 88. This semiconductor layer can have sublayers of different semiconductors such as an initial layer of cadmium sulfide covered by a layer of cadmium telluride. The first set of scribes 24a and 24b are scribed through both the metallic layer 98 and the semiconductive layer 100 as shown in FIG. 10 so that the cells 96 are electrically isolated from each other at the metallic layer 98 adjacent the glass sheet substrate. After this initial scribing, a dielectric material 102 is applied to fill the first set of spaced scribes $24_a$ and $24_b$. The second set of scribes 78a and 78b are then formed extending through the semiconductive layer 100 but do not penetrate the metallic layer 98. Another metallic layer 104 is deposited over the semiconductor layer 100 and over the dielectric material 102 in the first set of scribes, and the metallic layer 104 also coats the walls of the second set of scribes $78_a$ and $78_b$ to make electrical contact with the metallic layer 98. The metal contact layer 104 may be made of multiple layers such as an initial sputter coated layer of nickel or chromium about 200 angstroms thick covered by another layer of aluminum about 3000 angstroms thick. It is also possible to protect the aluminum layer from oxidation by another layer of nickel or chromium. After making a third set of scribes $106_a$ and $106_b$ through the metallic layer 104 such as by the pulsed laser splitting processing of this invention, a dielectric material 108 that is conventionally provided by the panel encapsulation process fills the third set of scribes $106_a$ and $106_b$ to provide the functional photovoltaic cells 96.

The manner in which the sets of scribes are provided while referenced to the previously formed sets of scribes as previously described in connection with FIGS. 8 and 9 allows a relatively closed spacing of the scribes $24_a$, $78_a$ and $108_a$ etc. so that there is minimal wasted space of the semiconductor material that is not functional at the junctions of the cells with each other.

It should also be noted that the apparatus illustrated in FIGS. 8 and 9 illustrates the same laser source 28 and same rotating polygonal mirror 36 for generating the second set of scribes and well as the first set of scribes, which is entirely possible after making any necessary adjustments to the control 48. However, on a high production basis, it is also possible to utilize separate systems with associated pulsed laser sources, rotating mirrors and controls for generating each set of scribes. Furthermore, each set of scribes can be made in accordance with the invention by a single laser source with a single unidirectional movement (i.e., "pass") of the substrate, although it is also possible to make each set of scribes by multiple laser sources that perform the scribing during a single pass of the substrate. Furthermore, the scribing can be performed with a single layer source and multiple passes that may be in the same direction or in opposite directions as is most convenient for the particular scribing being performed and the equipment being utilized.

While the best mode for carrying out the invention has been described in detail, those familiar with the art to which this invention relates will recognize various alternatives for practicing the invention as defined by the following claims.

What is claimed is:

1. Apparatus for laser scribing a coated substrate:

a laser source for generating a pulsed laser beam having laser pulses with sufficient power to form ablations through a coating on the substrate;

a polygonal mirror mounted for rotation to reflect the laser pulses of the laser beam toward the substrate to split the laser beam and provide spaced ablations through the coating; and a conveyor for moving the substrate along a direction of conveyance so the ablations formed by the laser pulses reflected from the rotating polygonal mirror overlap each other and form a set of spaced scribes through the coating on the substrate and extending parallel to the direction of conveyance.

2. Apparatus for laser scribing a coated substrate as in claim 1 further including at least one lens through which the laser pulses are passed and directed toward the substrate to provide the ablations through the coating on the substrate.

3. Apparatus for laser scribing a coated substrate as in claim 1 further including a plurality of focusing lenses through which the laser pulses are passed and directed toward the substrate to provide the ablations through the coating on the substrate.

4. Apparatus for laser scribing a coated substrate as in claim 1 further including a field flattening lens through which the laser pulses are passed and directed toward the substrate to provide the ablations through the coating on the substrate.

5. Apparatus for laser scribing a coated substrate as in claim 1 further including a plurality of fiber optics through which the laser pulses are passed for passage toward the substrate to provide the ablations through the coating on the substrate.

6. Apparatus for laser scribing a coated substrate as in claim 5 further including at least one lens through which the laser pulses are passed from the fiber optics and directed toward the substrate to provide the ablations through the coating on the substrate.

7. Apparatus for laser scribing a coated substrate as in claim 1 further including a laser detector for detecting the rotational location of the rotating polygonal mirror.

8. Apparatus for laser scribing a coated substrate as in claim 1 further including a controller for generating a second set of laser pulses that are referenced to the first mentioned set of spaced scribes to generate a second set of scribes through the coating on the substrate in a spaced relationship from each other and from the first mentioned set of scribes.

9. Apparatus for laser scribing a coated substrate as in claim 8 wherein the controller includes a trigger beam actuator for generating trigger pulses referenced to the first mentioned set of spaced scribes to generate the second set of laser pulses that are directed toward the substrate to scribe the second set of scribes that are spaced on the substrate from each other and from the first mentioned set of spaced scribes.

10. Apparatus for laser scribing a coated substrate as in claim 8 wherein the controller includes a detector that compares the locations of the ablations provided by the second set of laser pulses with respect to the first mentioned set of scribes and provides adjustment as necessary to provide the desired spacing between the sets of scribes.

11. Apparatus for laser scribing a coated substrate:

a laser source for generating a pulsed laser beam having laser pulses with sufficient power to form ablations through a coating on the substrate;

a polygonal mirror mounted for rotation to split the laser beam and reflect the laser pulses of the laser beam toward the substrate;

at least one lens through which the laser pulses reflected from the rotating polygonal mirror are passed and directed toward the substrate to provide spaced ablations through the coating on the substrate;

a conveyor for moving the substrate along a direction of conveyance so the ablations formed by the laser pulses reflected from the rotating polygonal mirror overlap each other and form a first set of spaced scribes trough the coating on the substrate and extending parallel to the direction of conveyance; and a controller for generating a second set of laser pulses referenced to the first set of scribes and directed toward the substrate to generate in its coating a second set of scribes in a spaced relationship from each other and from the first set of scribes.

12. A method for laser scribing a coated substrate:

generating a pulsed laser beam having laser pulses with sufficient power to ablate through a coating on the substrate;

rotating a polygonal mirror to reflect the laser pulses of the laser beam toward the substrate to split the laser beam and form spaced ablations through the coating; and moving the substrate along a direction of conveyance so the ablations formed by the laser pulses overlap each other and form a set of spaced scribes through the coating on the substrate and extending parallel to the direction of conveyance.

13. A method for laser scribing a coated substrate as in claim 12 wherein the laser pulses reflected from the rotating polygonal mirror are passed through at least one lens to provide the ablations through the coating on the substrate.

14. A method for laser scribing a coated substrate as in claim 12 wherein the laser pulses reflected from the rotating polygonal mirror are focused through a plurality of focusing lenses to provide the ablations through the coating on the substrate.

15. A method for laser scribing a coated substrate as in claim 12 wherein the laser pulses reflected from the rotating polygonal mirror are passed through a field flattening lens to provide the ablations through the coating on the substrate.

16. A method for laser scribing a coated substrate as in claim 12 wherein the laser pulses are passed through a plurality of fiber optics toward the substrate to provide the ablations through the coating on the substrate.

17. A method for laser scribing a coated substrate as in claim 12 wherein the laser pulses are passed through a plurality of fiber optics to and through at least one lens toward the substrate to provide the ablations through the coating on the substrate.

18. A method for laser scribing a coated substrate as in claim 12 wherein the rotational position of the polygonal mirror is detected by a laser detector.

19. A method for laser scribing a coated substrate as in claim 12 wherein a second set of laser pulses is generated referenced to the set of scribes to provide a second set of scribes in a spaced relationship from each other and from the first mentioned set of scribes in the coating on the substrate.

20. A method for laser scribing a coated substrate as in claim 19 wherein trigger pulses are generated referenced to the set of spaced scribes to actuate generation of the second set of laser pulses that provide the second set of scribes that are spaced on the substrate from each other and from the first mentioned set of spaced scribes.

21. A method for laser scribing a coated substrate as in claim 12 wherein a second set of laser pulses is generated to provide overlapping ablations that provide a second set of scribes in the coating on the substrate and the locations of the overlapping ablations provided by the second set of laser pulses being detected and compared to the first mentioned set of scribes and any necessary adjustment is performed in order to provide a desired spaced relationship of the second set of scribes from each other and from the first mentioned set of scribes in the coating on the substrate.

22. A method for laser scribing a coated substrate as in claim 12 wherein the scribes are formed through a semiconductor coating on the substrate.

23. A method for laser scribing a coated substrate as in claim 12 wherein the scribes are formed through a semiconductor coating on a glass sheet substrate.

24. A method for laser scribing a coated substrate as in claim 12 wherein the scribes are formed through a metallic coating on the substrate.

25. A method for laser scribing a coated substrate as in claim 12 wherein the scribes are formed through a metallic coating on a glass sheet substrate.

26. A method for laser scribing a coated substrate:

generating a pulsed laser beam having a first set of laser pulses with sufficient power to ablate through a coating on the substrate;

rotating a polygonal mirror to split the laser beam and reflect the laser pulses of the laser beam toward the substrate;

focusing the laser pulses reflected from the rotating polygonal mirror through at least one lens to provide spaced ablations through the coating on the substrate;

moving the substrate along a direction of conveyance so the ablations formed by the laser pulses overlap each other and form a first set of spaced scribes through the coating on the substrate and extending parallel to the direction of conveyance; and generating a second set of laser pulses that are referenced to the first set of laser pulses that are directed toward the substrate to generate another set of laser pulses that scribe a second set of scribes that are spaced in the coating on the substrate from each other and from the first set of spaced scribes.

* * * * *

UNITED STATES PATENT AND TRADEMARK OFFICE
CERTIFICATE OF CORRECTION

PATENT NO. : 6,300,593 B1  Page 1 of 1
DATED : October 9, 2001
INVENTOR(S) : Ricky C. Powell It is certified that error appears in the above-identified patent and that said Letters Patent is hereby corrected as shown below:

<u>Column 8,</u>
Line 15, please replace "trough" with -- through --.

Signed and Sealed this

Seventh Day of May 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.   : 6,300,593 B1
DATED        : October 9, 2001
INVENTOR(S)  : Ricky C. Powell It is certified that error appears in the above-identified patent and that said Letters Patent is hereby corrected as shown below:

Column 1,
Line 10, please insert the following paragraph:

-- This invention was made with Government support under NREL Subcontract No. ZAK-8-17619-17, Prime Contract No. DE-AC36-98GO10337 awarded by the Department of Energy. The government has certain rights in this invention. --

Signed and Sealed this

Eighteenth Day of February, 2003

JAMES E. ROGAN
*Director of the United States Patent and Trademark Office*